(12) United States Patent
Ma et al.

(10) Patent No.: US 11,706,874 B2
(45) Date of Patent: Jul. 18, 2023

(54) ELECTRONIC-CIRCUIT PRINTING USING LOW-COST INK

(71) Applicant: Microsoft Technology Licensing, LLC, Redmond, WA (US)

(72) Inventors: Siyuan Ma, Bothell, WA (US); James David Holbery, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/533,656

(22) Filed: Aug. 6, 2019

(65) Prior Publication Data

US 2021/0045251 A1 Feb. 11, 2021

(51) Int. Cl.
*H05K 3/12* (2006.01)
*C09D 11/52* (2014.01)
*H05K 1/09* (2006.01)

(52) U.S. Cl.
CPC ............. *H05K 3/125* (2013.01); *C09D 11/52* (2013.01); *H05K 1/092* (2013.01); *H05K 3/1258* (2013.01); *H05K 3/1283* (2013.01)

(58) Field of Classification Search
CPC . B41M 1/04; B41M 1/12; B41M 1/22; B41M 5/0023; C09D 11/033; C09D 11/037; C09D 11/08; C09D 11/52; H05K 1/092; H05K 3/125; H05K 3/1258; H05K 3/1283
See application file for complete search history.

(56) References Cited

U.S. PATENT DOCUMENTS

| 6,322,620 | B1 | 11/2001 | Xiao |
| 9,598,776 | B2 | 3/2017 | Abed et al. |
| 9,613,911 | B2 | 4/2017 | Rogers et al. |
| 9,999,137 | B2 | 6/2018 | Ciufo et al. |
| 10,129,975 | B1 | 11/2018 | Tabor et al. |
| 2012/0170241 | A1* | 7/2012 | Nakako ................. C09D 11/52 361/783 |

(Continued)

FOREIGN PATENT DOCUMENTS

| CN | 108788124 A | 11/2018 |
| CN | 110016257 A | 7/2019 |

(Continued)

OTHER PUBLICATIONS

Mesh to Micron Conversion Table by 911 Metallurgist (Year: 2012).*
Dickey, et al., "Eutectic Gallium-Indium (EGain): A Liquid Metal Alloy for the Formation of Stable Structures in Microchannels at Room Temperature", In Journal of Advanced Functional Materials, vol. 18, Issue 7, Apr. 11, 2008, pp. 1097-1104.

(Continued)

*Primary Examiner* — Sathavaram I Reddy
(74) *Attorney, Agent, or Firm* — Alleman Hall Creasman & Tuttle LLP

(57) ABSTRACT

A method to manufacture an article comprises applying an ink to a substrate. The ink includes a liquid vehicle, a plurality of solid metal particles, a plurality of gallium-containing particles, and a thermally activated flux. The method further comprises curing the ink by heating the substrate to within an activation temperature range of the flux. The article manufactured by this method comprises a substrate, an electronically conductive film arranged on the substrate, and an adherent barrier layer covering both the substrate and the film. The film includes a plurality of solid metal particles with a gallium-based liquid metal bridging the plurality of solid metal particles.

13 Claims, 6 Drawing Sheets

(56) References Cited

U.S. PATENT DOCUMENTS

| | | | |
|---|---|---|---|
| 2013/0122205 A1 | 5/2013 | Mosley et al. | |
| 2013/0140069 A1 | 6/2013 | Kitajima et al. | |
| 2015/0380685 A1* | 12/2015 | Lee | H01L 51/5243 |
| | | | 257/40 |
| 2016/0317992 A1* | 11/2016 | Thuo | B82Y 40/00 |
| 2017/0283629 A1* | 10/2017 | Fortier | C09D 11/30 |
| 2018/0305563 A1* | 10/2018 | Oh | C09D 5/24 |

FOREIGN PATENT DOCUMENTS

| | | |
|---|---|---|
| EP | 2058081 A2 | 5/2009 |
| WO | 2018025271 A1 | 2/2018 |
| WO | 2019055680 A1 | 3/2019 |

OTHER PUBLICATIONS

Li, et al., "New Underfill Material Based on Copper Nanoparticles Coated with Silica for High Thermally Conductive and Electrically Insulating Epoxy Composites", In Journal of Materials Science, vol. 54, Issue 8, Jan. 14, 2019, 15 Pages.

Pekarovicova, et al., "Printing Ink Formulations", In Journal of Printing on Polymers, Dec. 2016, pp. 41-55.

Tavakoli, et al., "EGain-Assisted Room-Temperature Sintering of Silver Nanoparticles for Stretchable, Inkjet-Printed, Thin-Film Electronics", In Journal of Advanced Materials, vol. 30, Issue 29, May 29, 2018, 7 Pages.

"International Search Report and Written Opinion Issued in PCT Application No. PCT/US20/036870", dated Sep. 18, 2020, 15 Pages.

* cited by examiner

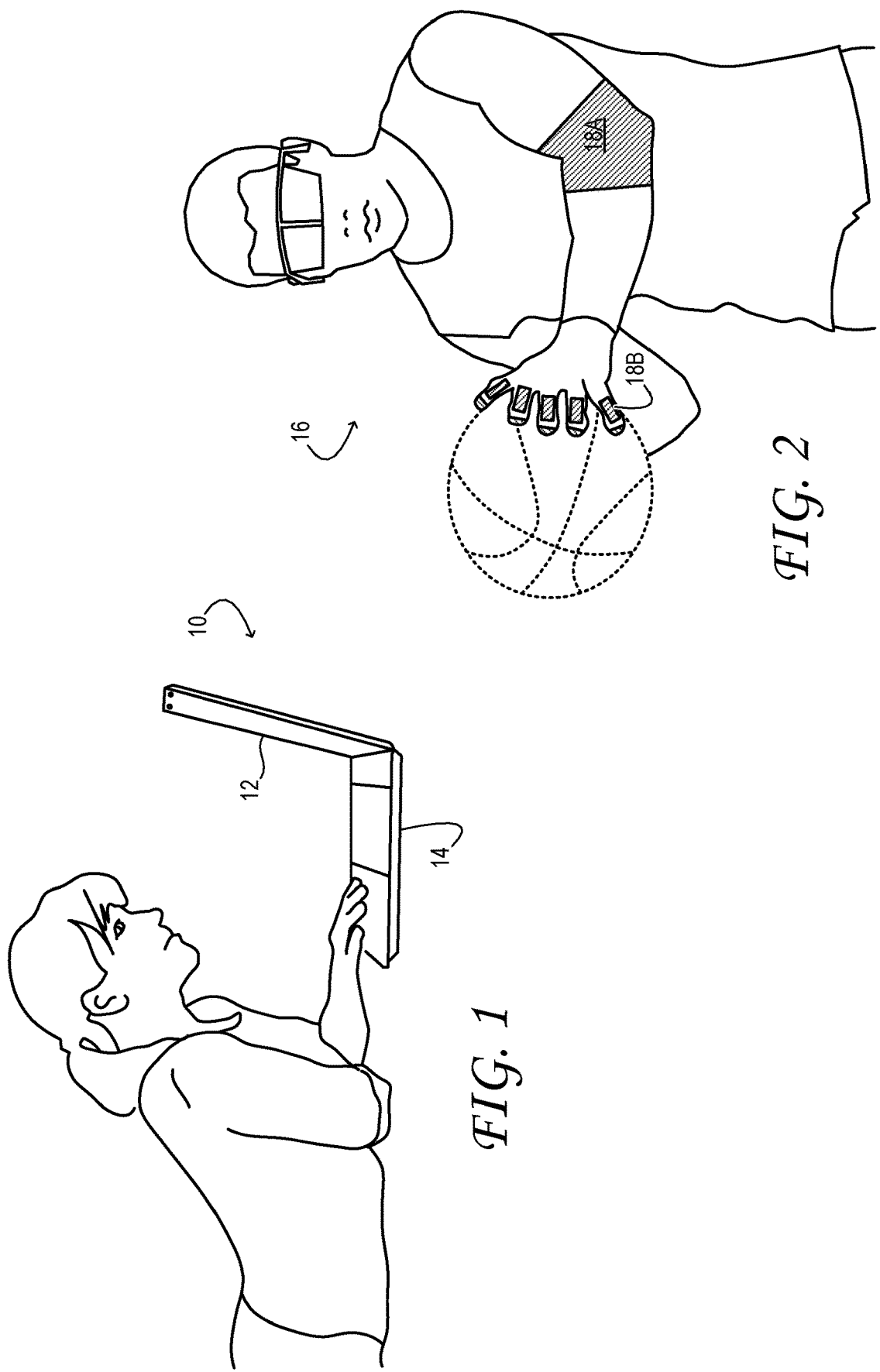

ELECTRONIC-CIRCUIT PRINTING USING LOW-COST INK

BACKGROUND

A printed circuit board for an electronic circuit may be made from a copper-clad substrate. The substrate may be patterned with a curable resist and chemically etched to remove the copper from areas outside of the desired conduction paths.

SUMMARY

Some disclosed examples relates to an article comprising a substrate, an electronically conductive film arranged on the substrate, and an adherent barrier layer covering both the substrate and the film. The electronically conductive film includes a plurality of solid metal particles with a gallium-based liquid metal bridging the solid metal particles. Other examples relate to an ink comprising a liquid vehicle, a plurality of solid metal particles, a plurality of gallium-containing particles, and a thermally activated flux. Still other examples relate to a method to manufacture an article. The method comprises applying an ink to a substrate, the ink including a liquid vehicle, a plurality of solid metal particles, a plurality of gallium-containing particles, and a thermally activated flux. The method further comprises curing the ink by heating the substrate to within an activation temperature range of the flux.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 1 and 2 show examples of electronic devices that may include one or more flexible electronic circuits.

DETAILED DESCRIPTION

Figure 3:
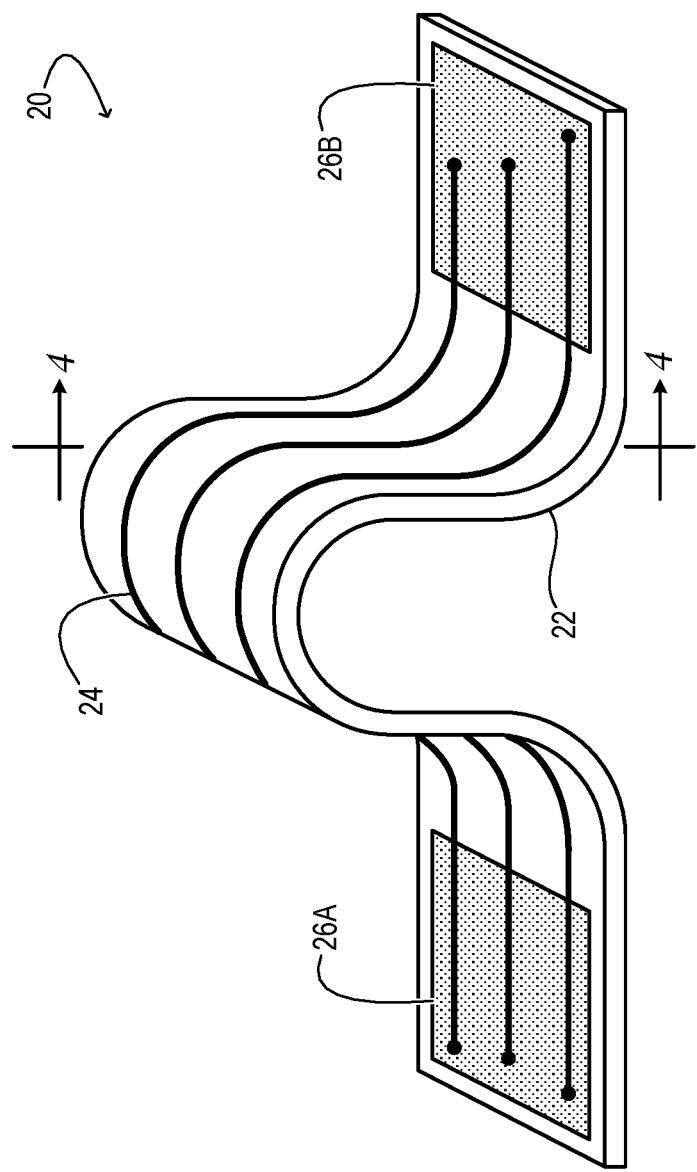
FIG. 3 shows an example of a flexible circuit board that may be included in an electronic device.

As described above, a printed circuit board for an electronic circuit may be made from a copper-clad substrate. The substrate may be patterned with a curable resist and chemically etched to remove the copper from areas outside of the desired conduction paths. However, such a method may be poorly suited to the manufacture of flexible circuit boards, as the copper traces so formed are susceptible to breakage with repeated flexion. In recent years, various alternatives to conventional chemical-etch processing have been developed for the manufacture of electronic circuit boards. However, such techniques may be based on the deposition of expensive metals onto the substrate, and still may not exhibit the desired durability in applications involving extreme or repeated flexion.

Thus, examples are disclosed herein that relate to printing electronic circuit traces on a variety of substrates, which include flexible substrates. The disclosed examples utilize a specially formulated ink that includes, in some examples, micron-scale copper particles and eutectic gallium-indium (EGaIn) in particulate form. The ink also includes a liquid vehicle and a thermally activated flux. The ink may be applied to the substrate via screen-printing, ink-jet printing, or various other techniques. Once applied, the ink is dried to remove the liquid vehicle and then heat cured at a temperature that is within the activation temperature range of the flux. The activated flux dissolves the oxide layer that natively coats the EGaIn and/or copper particles, allowing the EGaIn to form an adherent liquid-metal bridge between and among the copper particles. The resulting structure provides suitably high electronic conductance as well as flexibility.

The electronic conductance of traces formed from the cured ink derives from the bulk conductivity of copper and from wetting of the copper by the EGaIn, which reduces the accumulated effects of interfacial contact resistance over the length of a given trace. The flexibility of the traces is a result of the relatively low melting temperature of the EGaIn (approximately 15 degrees Celsius), which helps to ensure that the bridges between solid copper particles remain liquid at ordinary operating temperatures. In some examples, both the conductance and the flexibility may exceed that of competing formulations based on silver particles immobilized in a resin, where electronic conduction occurs by percolation through a network of all solid particles. Furthermore, the inks herein may be less expensive than silver-based inks, due to the lower cost of the constituent metals relative to silver.

This disclosure will now be presented by way of example and with reference to the drawing figures listed above. Components, process steps, and other elements that may be substantially the same in one or more of the figures e identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

FIGS. 1 and 2 show examples of electronic devices that may include one or more flexible electronic circuits. FIG. 1 shows an example device in the form of a laptop computer 10 having a display portion 12 and a keyboard portion 14, which are connected by a hinge. Electrical conductors arranged on a flexible circuit board may join the internal componentry of the display portion to the internal componentry of the keyboard portion. These conductors must be flexible enough to endure numerous cycles of opening and closing the laptop computer without breakage or significant loss of electronic conductivity. The internal circuitry of the keyboard portion itself may also include a flexible circuit board having numerous conductive paths that are subject to repeated mechanical stress.

FIG. 2 shows another example device in the form of a virtual-reality (VR) system 16 that includes a plurality of joint sensors 18 (e.g., 18A, 18B). Each joint sensor may be configured to electronically sense the angle of an anatomical joint of the player and to report the angle to control componentry of the VR system. To that end, each joint sensor may include circuitry that conforms to and flexes with its associated anatomical joint. Again, the electronic conductors running through each of the joint sensors must be resistant to damage from repeated flexion.

FIG. 3 shows an example article in the form of a flexible circuit board 20 that may be included in an electronic device. The flexible circuit board includes a flexible substrate 22 and a plurality of electronically conductive traces 24, which may conduct electrical signals or power between electronic components 26A and 26B.

Figure 4:
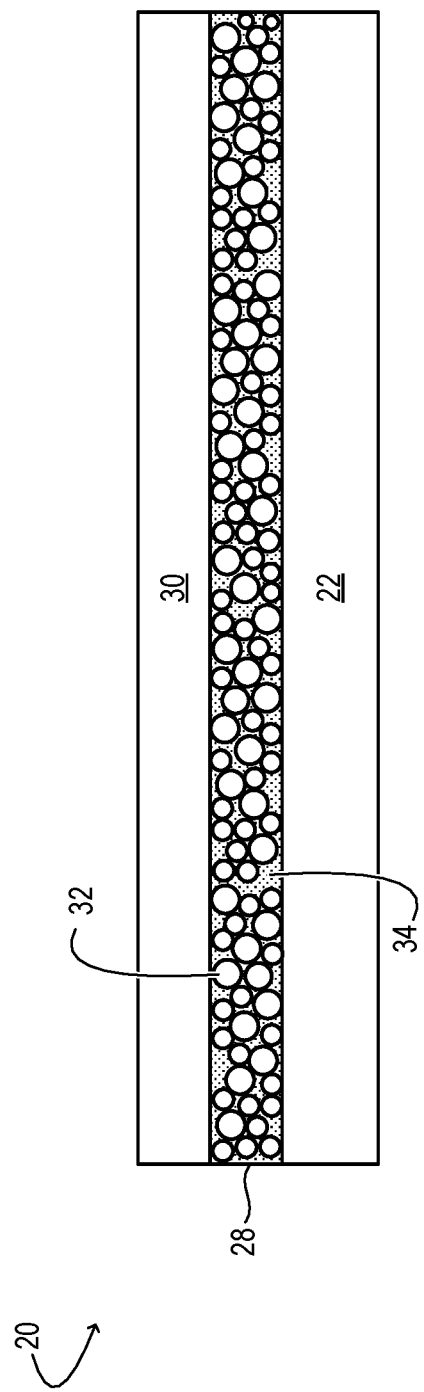
FIG. 4 shows a cross section of a portion of the flexible circuit board of FIG. 3.

FIG. 4 shows a cross section of circuit board 20 through an area including electronically conductive trace 24, taken along line 4-4 of FIG. 3. In particular, the drawing shows substrate 22, an electronically conductive film 28 arranged on the substrate, and an adherent barrier layer 30 covering both the substrate and the film.

As noted above, substrate 22 may be flexible in some examples, but may be rigid in others. The dimensions and composition of the substrate are not particularly limited. In some examples, the substrate may be about one millimeter (mm) in thickness, although thicker and thinner substrates are also envisaged. In some examples, the substrate may comprise a cured polymer resin, such as a polyimide, polytetrafluoroethylene, or polysiloxane polymer. Numerous other polymer and non-polymer substrates may also be used.

Electronically conductive film 28 includes a plurality of solid metal particles 32 and a gallium-based liquid metal 34 bridging the plurality of solid metal particles. The solid metal particles may be particles that exhibit a relatively high (e.g., copper-like) bulk electronic conductivity, and the gallium-based liquid also may have a suitable bulk electronic conductivity. The solid metal particles and the gallium-based liquid metal may be chosen such that the liquid metal is capable of wetting the solid metal particles under desired conditions. The term 'wetting' will be understood in the context of interfacial physical chemistry. In short, A is capable of wetting B if A has a greater attraction to the surface of B than to the surface of A. This condition enables A to coat the surface of B uniformly and to resist beading up. In some examples, gallium-based liquid metal 34 may not only wet but also alloy solid metal particles 32, resulting in partial dissolution of the solid metal particles into the liquid metal.

Gallium-based liquid metal 34 may also include, in addition to gallium, other metals, such as indium and/or tin. Accordingly, the gallium-based liquid metal may comprise EGaIn or indium-gallium-tin materials, as non-limiting examples. In the examples here contemplated, the gallium-based liquid metal is flowable at 25° C. or below. Due to this property, electronically conductive film 28 may be a flexible film—i.e., capable of undergoing repeated flexion without significant loss of electronic conductance. In some examples, the electronic conductance of the film may be substantially unchanged after numerous (e.g., one million) flexion events. In some examples, the film may be highly flexible even to the degree of being bendable. In some examples, the film may be bendable to a radius of curvature of about one millimeter. In some examples, the film may be bendable even to the degree of being foldable.

Adherent barrier layer 30 is configured to protect electronically conductive film 28 from abrasion and other forms of mechanical stress. The adherent barrier layer is also configured to protect the electronically conductive film from oxidation and other forms of chemical stress. In particular, the adherent barrier layer is configured to reduce the rate of diffusion of atmospheric oxygen to the oxidizable metal constituents of the electronically conductive film. To this end, the adherent barrier layer may include an elastomeric layer of suitable thickness. In some examples, the adherent barrier layer may be at least twice as thick as the largest of the solid metal particles 32 in the electronically conductive film. In one example, the adherent barrier layer may comprise a silicone elastomer—e.g., polydimethylsiloxane (PDMS), which may be cast down to a thickness of about 10 micrometers (μm). If a more robust barrier is desired (e.g., mechanically, or in terms of its ability to impede oxidation), then the thickness of the adherent barrier layer could be made greater, for example, by one or more orders of magnitude. More generally, the adherent barrier layer may include any suitably adherent and flexible electrical insulator. In some examples, the adherent barrier layer may take the form of an adhesive layer that bonds the substrate and film to another layer of the article.

Figure 5:
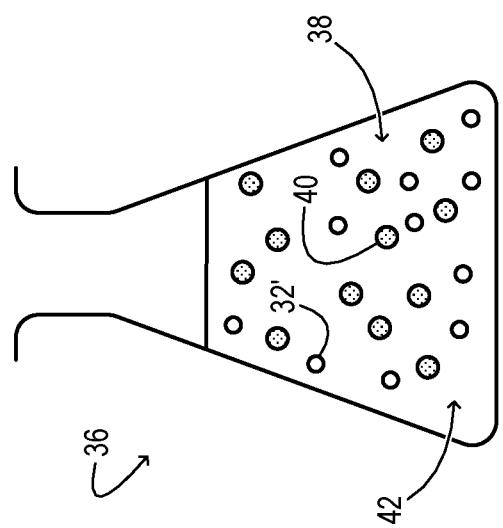
FIG. 5 provides a visual illustration of an example electronically conductive ink that may be used in the manufacture of a flexible circuit board or other article.

Circuit board 20 and other articles described herein may be formed by application of an electronically conductive ink to substrate 22. When referring to ink, the term 'electronically conductive' applies to the state of the traces formed from the ink after curing, rather than to the uncured product. FIG. 5 provides an illustration of an example electronically conductive ink 36. The depicted ink includes a liquid vehicle 38, a plurality of solid metal particles 32', a plurality of gallium-containing particles 40, and a thermally activated flux 42. The ink may also include one or more additives, as described further below.

In some examples, liquid vehicle 38 may include water. Organic liquids may also be used, however, alternatively or in addition to water. The range of organic liquids envisaged is not particularly limited, and may include alcohols (e.g., methanol, ethanol, 1-propanol, and 2-propanol), ketones (e.g., acetone and methylethylketone), and nitriles (e.g., acetonitrile and propionitrile), among others.

In some examples, each of the plurality of gallium-containing particles 40 may be a liquid-metal droplet. The gallium-containing particles may include droplets of EGaIn and/or an indium-gallium-tin material, for instance. Typically, the surface of a liquid-metal droplet or other gallium-containing particle supports a native oxide layer that prevents agglomeration under conditions at which electronically conductive ink 36 is stored. As described in further detail below, a flux may be included that can be activated to dissolve the native oxide and facilitate agglomeration of the gallium-containing particles. In some examples, the plurality of gallium-containing particles may have a controlled size distribution. The desired size distribution may be arrived at, for example, by dispersing gallium-based liquid metal in liquid vehicle 38 using ultrasound, as described hereinafter.

In some examples, the plurality of solid metal particles 32' may take the form of metal flake or metal fibers. Further, in some examples, the plurality of solid metal particles may take the form of metal spheres. In some examples, the average length of a solid metal particle may be from about 1 micron (μm) to about 5 μm. In some examples, the solid metal particles may be sized so as to pass through a 200-mesh screen. In other examples, particles of any other suitable size and/or morphology may be used.

Solid metal particles 32' may include copper and/or a copper alloy. However, other metals such as nickel, tin, and alloys thereof, are also envisaged. In some examples, the solid metal particles may be surface-modified. Surface modification may be used, for example, to passivate a relatively oxidizable metal particle (e.g., copper) by application of a very thin coating or partial coating of a less oxidizable metal (e.g., nickel or tin). Surface modification may be used in order to form a non-native coating on the solid metal particles that is readily dissolved or displaced by thermally activated flux 42 (vide infra), at temperatures at which electronically conductive ink 36 is cured. Surface modification may also be used to increase the affinity of a solid metal particle for gallium-based liquid metal 34.

In some examples, for instance, solid metal particles 32' may be modified by addition of a surface layer of a metal such as indium, which, at temperatures at which electronically conductive ink 36 is cured, will alloy gallium-containing particles 40 to form gallium-based liquid metal 34. Accordingly, examples are envisaged in which gallium-containing particles 40 are solid in the ink but liquify at the curing temperature and react with the surface coating on solid metal particles 32', to form metal 34 in its final state. Solid gallium-containing particles suitable for this implementation include elemental gallium and various gallium alloys which are solid at room temperature but become flowable at temperatures at which the ink is cured.

Thermally activated flux 42 may be characterized by an activation temperature range. The flux may be any chemical agent, which, at temperatures within its activation temperature range, will dissolve the native oxide formed on the surface of the gallium-containing particles 40 and/or solid metal particles 32'. The dissolution chemistry employed by the flux is not particularly limited: the flux may be acidic, reducing, or coordinating, for example. The thermally activated flux and the gallium-containing particles may be selected in a coordinated manner, so that the gallium-containing metal particles are Plowable within the activation temperature range of the flux. In some examples, thermally activated flux 42 may include a natural rosin. One example of a natural rosin suitable for use as a flux is gum arabic (gum acacia). However, other natural rosins are also envisaged. Non-limiting examples include alginic acid sodium salt from brown algae and (hydroxypropyl)methyl cellulose.

In some examples, electronically conductive ink 36 may include a liquid additive miscible with liquid vehicle 38 but having a higher boiling point than the liquid vehicle. In such examples, such an additive may be used in order to reduce the volatility of the ink, to prevent excessively rapid drying. Additives usable for this purpose include glycerin and ethylene glycol, for example, in implementations in which the liquid vehicle is water. In some examples, electronically conductive ink 36 may include a liquid additive miscible with liquid vehicle 38 and selected to increase the solubility of thermally activated flux 42 in the liquid vehicle. Suitable examples include organic solvents such as ethanol, 1-propanol, or 2-propanol. Ionic and non-ionic surfactants may also be used to increase the solubility of the thermally activated flux in liquid vehicles such as water.

Figure 6:
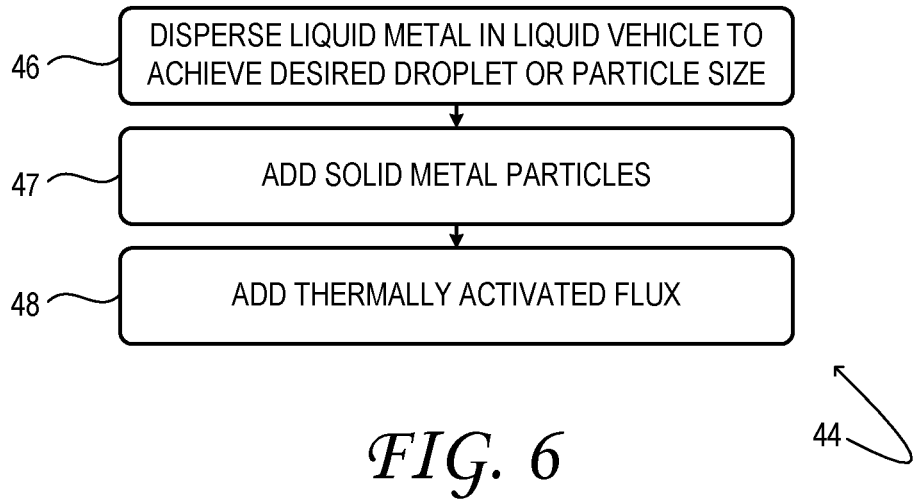
FIG. 6 illustrates an example method to prepare the electronically conductive ink of FIG. 5.

FIG. 6 illustrates an example method 44 to prepare an electronically conductive ink. At 46 of method 44 a gallium-containing liquid metal is dispersed in a liquid vehicle in order to achieve a desired droplet or particle-size distribution. In some examples, the gallium-containing liquid metal droplets may have a size (i.e., diameter) distribution on the order of 1 μm or less. In some examples, the gallium-containing liquid metal droplets may have a size distribution of tens of microns. In some examples, the liquid metal may be dispersed using ultrasound, to achieve a colloidal or semi-colloidal suspension. Generally speaking, the size distribution achieved using ultrasound is a function of the surface-tension modifiers added to the liquid vehicle, to the temperature, ultrasound frequency, and input power. Higher intensities and longer durations of ultrasonic treatment may lead to the formation of smaller gallium-containing particles. Additives that reduce the surface tension of the liquid vehicle (e.g., detergents) may also encourage the formation of smaller particles. Typically, the gallium-containing particles so formed support a native oxide coating that greatly retards or substantially prevents further changes to the particle-size distribution. Non-ultrasonic dispersion (e.g., dispersion based on sieving) is also envisaged.

At 48 an electronically conductive ink is formed by mixing a liquid vehicle such as liquid vehicle 38 of the above description, solid metal particles such as solid metal particles 32', gallium-containing particles such as gallium-containing particles 40, and a thermally activated flux such as thermally activated flux 42. At 47, the solid metal particles are combined with the liquid vehicle containing gallium-containing particles at the desired particle-size distribution. At 48 the thermally activated flux is combined with the above mixture at the prescribed quantity, so as to achieve a desired formulation. Some example formulations may include copper particles at 0.1 to 20% by mass, EGaIn at 0.1 to 20%, a liquid vehicle at 50 to 100%, and a flux at 10% or less. Some example formulations may include copper particles at 10 to 30% by mass, EGaIn at 1 to 30%, a liquid vehicle at 30 to 90%, and a flux at 10% or less. Some example formulations may include copper particles at about 30% by mass, EGaIn at about 10%, an aqueous liquid vehicle at about 50%, and a flux at about 10%. Some example formulations may include copper particles at about 20% by mass, EGaIn at about 5%, an aqueous liquid vehicle at about 69%, a flux at about 5%, and a polyvinylpyrrolidone additive at about 1%. It will be noted that the formulations above are entirely non-limiting, and that the various components of the ink may be added in any suitable order.

Figure 7:
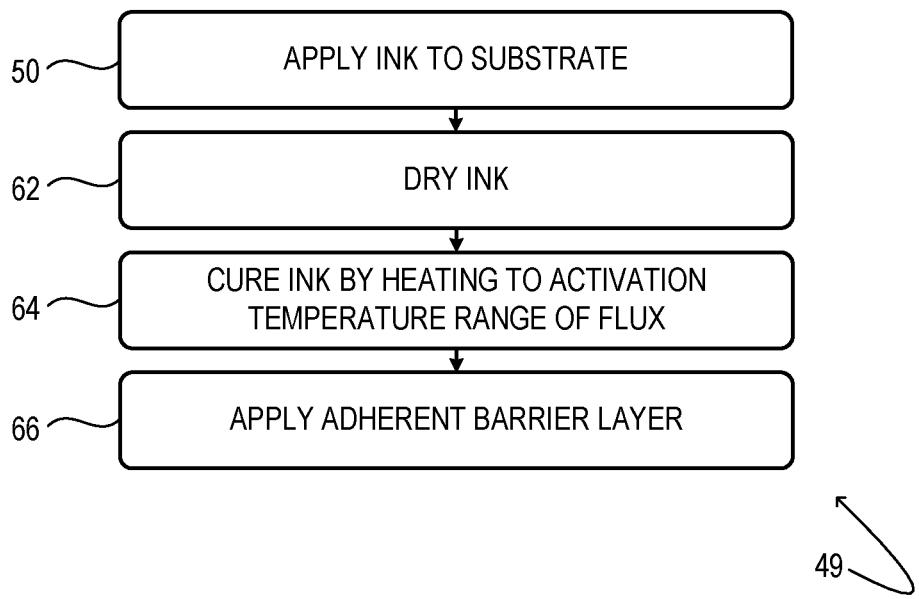
FIG. 7 illustrates an example method to manufacture a flexible circuit board or other article using the electronically conductive ink of FIG. 5.
Figure 8:
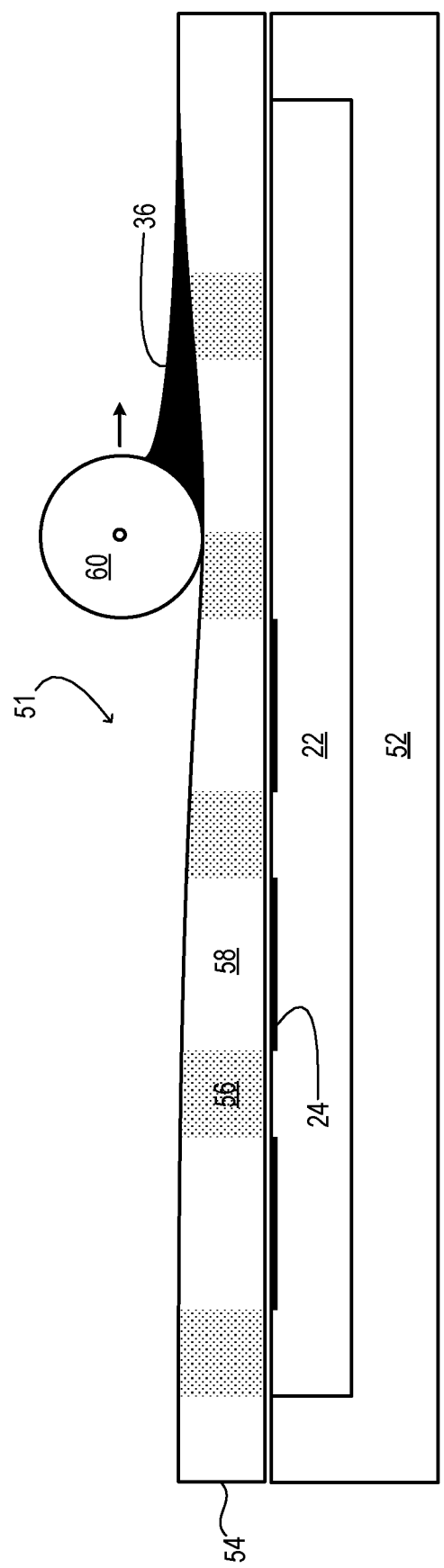
FIG. 8 shows aspects of an example screen-print apparatus for manufacturing a flexible circuit board or other article.

FIG. 7 illustrates an example method 44 to manufacture an article using the electronically conductive ink prepared as illustrated in FIG. 6. At 50 the electronically conductive ink is applied to a substrate. In examples in which screen printing is the desired application technique, a screen may be arranged on the substrate. The screen may be a 200-mesh screen of stainless-steel wires, for example, with a portion of the cells filled by a hardened resin to mask areas of the substrate where no ink is to be applied. The ink is then forced through the screen using a roller or squeegee. FIG. 8 shows an example screen-print apparatus 51 comprising a platen 52 for securing substrate 22, a screen 54 with filled cells 56 and unfilled cells 58. Roller 60 forces the electronically conductive ink 36 through the unfilled cells to print the circuit traces 24, which are revealed when the screen is lifted away.

Returning now to FIG. 7, at 62 the electronically conductive ink is dried at a temperature that is below the activation temperature range of the thermally activated flux. The ink may be dried by blowing warm or unheated air over the substrate, for example. At 64 the ink is cured by heating the substrate to within the activation temperature range of the flux. Microwave heating, convection heating, hot air, etc., may be used to achieve an appropriate curing temperature. At temperatures within the activation temperature range of the thermally activated flux, the thermally activated flux dissolves the oxide coating of the gallium-containing particles and/or the oxide coating of the solid metal particles. Because the gallium-containing particles are free of the oxide coating and flowable within the activation temperature range of the thermally activated flux, the gallium containing particles may coalesce, wet, and in some examples alloy the solid metal particles. The term 'curing' is used herein to describe this process and variants thereof. The result of the curing is the formation of one or more electronically conductive circuit traces on the substrate in the form of one or more electronically conductive films. At 66 an adherent barrier layer is applied so as to cover both the substrate and the one or more films, thereby protecting the films from mechanical and chemical stress.

No aspect of the foregoing drawings or description should be interpreted in a limiting sense, because numerous variations, extensions, and omissions are also envisaged. For instance, although screen printing is described above, alternative methods of ink application are equally contemplated. Such methods include spray coating, ink-jet coating, and brush coating, as non-limiting examples.

One aspect of this disclosure is directed to an article comprising a substrate, an electronically conductive film, and a barrier layer covering the substrate and the film. Arranged on the substrate, the film includes a plurality of solid metal particles and a gallium-based liquid metal bridging the plurality of solid metal particles.

In some implementations of the above aspect, the substrate is a flexible substrate, the film is a flexible film, and the barrier layer is a flexible barrier layer. In some implementations of the above aspect, the film is bendable to a radius of curvature of one millimeter. In some implementations of the above aspect, the substrate includes a polyimide. In some implementations of the above aspect, the gallium-based liquid metal is flawable at 25° C.

Another aspect of this disclosure is directed to an ink comprising a liquid vehicle, a plurality of solid metal particles, a plurality of gallium-containing particles, and a thermally activated flux.

In some implementations of the above aspect, each of the plurality of solid metal particles includes copper. In some implementations of the above aspect, each of the plurality of solid metal particles includes a copper alloy. In some implementations of the above aspect, each of the plurality of solid metal particles is sized so as to pass through a 200-mesh screen. In some implementations of the above aspect, the thermally activated flux is characterized by an activation temperature range, and the plurality of gallium-containing particles are flowable within the activation temperature range. In some implementations of the above aspect, the thermally activated flux includes gum arabic. In some implementations of the above aspect, each of the plurality of gallium-containing particles includes a liquid-metal droplet. In some implementations of the above aspect, the plurality of gallium-containing particles has an average size in a range of 50 microns or less. In some implementations of the above aspect, the plurality of gallium-containing particles includes eutectic gallium-indium. In some implementations of the above aspect, the ink further comprises an additive to increase a solubility of the thermally activated flux in the liquid vehicle.

Another aspect of this disclosure is directed to a method to manufacture an article. The method comprises applying an ink to a substrate, the ink including a liquid vehicle, a plurality of solid metal particles, a plurality of gallium-containing particles, and a thermally activated flux. The method further comprises curing the ink by heating the substrate to within an activation temperature range of the flux.

In some implementations of the above aspect, the method further comprises forming the ink by mixing the liquid vehicle, the plurality of solid metal particles, the plurality of gallium-containing particles, and the thermally activated flux. In some implementations of the above aspect, applying the ink to the substrate includes applying via screen printing. In some implementations of the above aspect, applying via screen printing includes forcing the ink through a screen. In some implementations of the above aspect, the method further comprises drying the ink below the activation temperature range of the flux prior to curing the ink.

It will be understood that the configurations and/or approaches described herein are exemplary in nature, and that these specific embodiments or examples are not to be construed in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various configurations, properties, functions, processes, acts, and other features disclosed herein, as well as any and all equivalents thereof.

The invention claimed is:

1. An article comprising:
   a substrate;
   an electronically conductive film arranged on the substrate, the electronically conductive film including a plurality of copper particles and eutectic gallium-indium, the eutectic gallium-indium bridging the plurality of copper particles, the plurality of copper particles being wettable and/or alloyable by the eutectic gallium-indium, wherein a ratio of mass of the eutectic gallium-indium to mass of the plurality of copper particles is within a range of 0.1:20 to 20:0.1;
   a flux material configured to remove an oxide from a surface of the eutectic gallium-indium when heated to an activation temperature; and
   a barrier layer covering the substrate and the electronically conductive film.

2. The article of claim 1 wherein the substrate is a flexible substrate, the electronically conductive film is a flexible film, and the barrier layer is a flexible barrier layer.

3. The article of claim 1 wherein the electronically conductive film is bendable to a radius of curvature of one millimeter.

4. The article of claim 1 wherein the substrate includes a polyimide.

5. An ink comprising:
   a liquid vehicle;
   a plurality of copper particles in an amount between 0.1% and 30% by mass of the ink;
   a plurality of gallium-containing particles comprising eutectic gallium-indium, the gallium-containing particles are configured to, on dissolution of a surface oxide of the plurality of gallium-containing particles, wet and/or alloy the plurality of copper particles, the plurality of gallium-containing particles included in an amount between 0.1% and 30% by mass of the ink; and a thermally activated flux configured to, within an activation temperature range, dissolve the surface oxide of the plurality of gallium-containing particles, thereby enabling the plurality of gallium-containing particles to interact with the plurality of copper particles.

6. The ink of claim 5 wherein each of the plurality of copper particles includes copper.

7. The ink of claim 5 wherein each of the plurality of copper particles includes a copper alloy.

8. The ink of claim 5 wherein each of the plurality of copper particles is sized so as to pass through a 200-mesh screen.

9. The ink of claim 5 wherein the plurality of gallium-containing particles are flowable within the activation temperature range.

10. The ink of claim 5 wherein the thermally activated flux includes gum arabic.

11. The ink of claim 5 wherein each of the plurality of gallium-containing particles includes a liquid-metal droplet.

12. The ink of claim 5 wherein the plurality of gallium-containing particles has an average size in a range of 50 microns or less.

13. The ink of claim 5 further comprising an additive to increase a solubility of the thermally activated flux in the liquid vehicle.

* * * * *